(12) United States Patent
Ohashi et al.

(10) Patent No.: US 9,275,940 B2
(45) Date of Patent: Mar. 1, 2016

(54) SEMICONDUCTOR DEVICE AND MANUFACTURING METHOD THEREOF

(71) Applicant: Renesas Electronics Corporation, Kawasaki-shi (JP)

(72) Inventors: Akira Ohashi, Kawasaki (JP); Akira Umezu, Kawasaki (JP); Hiromitsu Takeda, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/328,527

(22) Filed: Jul. 10, 2014

(65) Prior Publication Data
US 2015/0021749 A1 Jan. 22, 2015

(30) Foreign Application Priority Data
Jul. 19, 2013 (JP) .................................. 2013-150391

(51) Int. Cl.
*H01L 23/495* (2006.01)
*H01L 21/48* (2006.01)
*H01L 23/00* (2006.01)
*H01L 23/498* (2006.01)
*H01L 23/31* (2006.01)

(52) U.S. Cl.
CPC ........ *H01L 23/4952* (2013.01); *H01L 21/4821* (2013.01); *H01L 23/49838* (2013.01); *H01L 24/06* (2013.01); *H01L 24/97* (2013.01); *H01L 23/3128* (2013.01); *H01L 23/49816* (2013.01); *H01L 24/45* (2013.01); *H01L 24/48* (2013.01); *H01L 2224/05553* (2013.01); *H01L 2224/05554* (2013.01); *H01L 2224/0603* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/49171* (2013.01); *H01L 2224/49433* (2013.01); *H01L 2224/73265* (2013.01); *H01L 2224/92247* (2013.01); *H01L 2224/97* (2013.01); *H01L 2924/15311* (2013.01); *H01L 2924/181* (2013.01)

(58) Field of Classification Search
USPC .................. 257/666, 673, 676, 690, E33.066, 257/E23.031, E23.042
See application file for complete search history.

(56) References Cited

U.S. PATENT DOCUMENTS 7,745,941 B2 6/2010 Kuroda et al.
2007/0262431 A1* 11/2007 Kuroda et al. ................ 257/678

FOREIGN PATENT DOCUMENTS

| JP | 2000-294684 A | 10/2000 |
|---|---|---|
| JP | 2000294684 | * 10/2000 |
| JP | 4942020 B2 | 5/2012 |

*Primary Examiner* — Timor Karimy
(74) *Attorney, Agent, or Firm* — McGinn IP Law Group, PLLC

(57) ABSTRACT

A semiconductor device is provided which complies with restrictions on layout on a mounting substrate side. The semiconductor device includes a wiring substrate having a plurality of bonding leads at an upper surface having a rectangular shape, a semiconductor chip mounted over the upper surface of the wiring substrate, and having a plurality of electrode pads at a main surface having a rectangular shape similar to a square shape, and a plurality of metal wires for coupling the bonding leads of the wiring substrate to the electrode pads of the semiconductor chip. In a BGA, the metal wires are arranged at three sides of a main surface of the semiconductor chip, the bonding leads are provided in lines at the upper surface of the wiring substrate outside the respective opposed short sides of the main surface of the semiconductor chip, and the metal wires are coupled to the bonding leads.

16 Claims, 13 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2013-150391 filed on Jul. 19, 2013 including the specification, drawings and abstract is incorporated herein by reference in its entirety.

BACKGROUND

The present invention relates to semiconductor devices and manufacturing techniques thereof, and more specifically, to a technique effectively applied to a semiconductor device with a semiconductor chip mounted over a wiring substrate, and assembly of the semiconductor device.

Japanese Patent Publication No. 4942020 (Patent Document 1) discloses a stacked structure including a laminate of two semiconductor chips accommodated in one package. Specifically, the two semiconductor chips are stacked on each other over a module substrate, and respectively coupled to bonding leads on the module substrate via wires.

Further, Japanese Unexamined Patent Publication No. 2000-294684 (Patent Document 2) discloses a structure including a semiconductor chip mounted at the center of a surface of a quadrilateral package base. A plurality of bonding leads is arranged in two lines at the periphery of the center on the same plane of the package base.

RELATED ART DOCUMENTS

Patent Documents

[Patent Document 1]
Japanese Patent Publication No. 4942020
[Patent Document 2]
Japanese Unexamined Patent Publication No. 2000-294684

SUMMARY

For example, a for semiconductor devices mounted on electronic devices, such as a tablet mobile terminal, (hereinafter also referred to as a "package" or "semiconductor package"), when being mounted on a display unit or the like of the electronic device, inmost cases, the semiconductor device is positioned on an elongated mounting substrate accommodated at the margin of a main body of the display unit, such as a liquid crystal panel.

In such a case, the planar shape of a package substrate included in the semiconductor device becomes elongated, which results in restrictions on planar shape of the package substrate.

On the other hand, in order to improve the processing speed of the semiconductor chip assembled in the semiconductor device, the semiconductor chip including a combination of a memory circuit, such as a dynamic random access memory (DRAM), and a logic circuit, such as a processor is often used. Such a compound semiconductor chip preferably has a circuit layout with the memory circuit occupying a large area and a plurality of logic circuits disposed around the memory circuit so as to improve an area efficiency and a design efficiency.

Thus, a main surface of the compound semiconductor chip becomes substantially square, which creates restrictions on planar shape of the main surface of the semiconductor chip.

That is to say, in the semiconductor device structure described above, the semiconductor chip having a substantially square shape is mounted on the elongate package substrate. Further, the above-mentioned compound semiconductor chip includes the logic circuits in addition to the memory circuit, leading to a relatively high number of pads for a probe test and wire bonding.

As a result, from the viewpoint of the space, it is difficult to arrange the bonding wires at four sides of the semiconductor chip due to the relationship in planar shape between the package substrate and semiconductor chip.

Although each of Patent Documents 1 and 2 discloses the structure with the semiconductor chip and the substrate coupled together by bonding wires, these patent documents fail to take into consideration the structure having the substantially square-shaped semiconductor chip mounted on the elongated substrate with many pads.

Other problems and new features of the present invention will be clarified in the following detailed description in connection with the accompanying drawings.

According to one aspect of the invention, a semiconductor device includes a wiring substrate having a plurality of bonding leads at an upper surface having a rectangular shape, a semiconductor chip mounted over the upper surface of the wiring substrate, and having a plurality of electrode pads at a main surface having a rectangular shape, a plurality of metal wires for coupling the bonding leads of the wiring substrate to the electrode pads of the semiconductor chip, and a plurality of terminals for external coupling provided at a second surface of the wiring substrate. In the semiconductor device, the metal wires are arranged at three out of four sides of the main surface of the semiconductor chip. Further, the bonding leads are provided in lines at the first surface of the wiring substrate along a short side of the first surface outside the respective sides of any one of two pairs of the opposed sides of the main surface of the semiconductor chip, and the metal wires are electrically coupled to the leads.

According to the one embodiment of the invention, the semiconductor device that complies with restrictions on layout on a mounting substrate side can be achieved.

DETAILED DESCRIPTION

Figure 1:
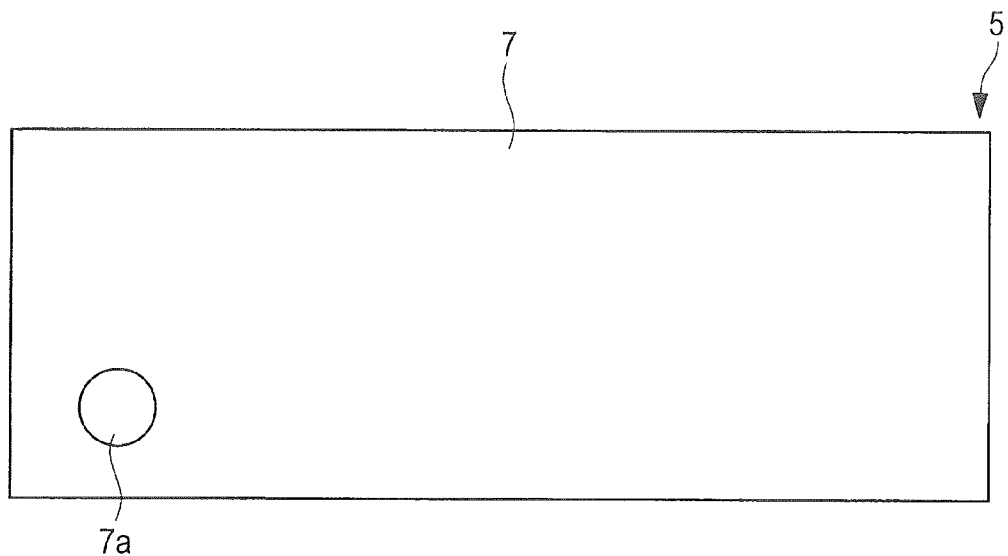
FIG. 1 is a plan view showing one example of the structure of a semiconductor device according to one embodiment of the invention.

In the following embodiments, the same or similar parts will not be repeatedly described in principle unless absolutely necessary.

The following preferred embodiments of the invention may be described below by being divided into a plurality of sections or embodiments for convenience, if necessary, which are not independent from each other unless otherwise specified. One of the sections or embodiments may be a modified example, a detailed description, or supplementary explanation of a part or all of the other.

Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when limited to the specific number in principle.

The components (including elemental steps) in the embodiments below are not necessarily essential unless otherwise specified, and except when clearly considered to be essential in principle.

In the embodiments below, the term "composed of A", "comprised of A", "having A", and "including A" as to the component and the like does not exclude elements other than the element "A", unless otherwise specified and except when considered to be consisting of only the element A from the context. Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above numerical value, and the range.

Preferred embodiments of the invention will be described in detail below based on the accompanying drawings. In all drawings for explaining the embodiments, parts having the same functions are indicated by the same or similar reference characters, and the repeated description thereof will be omitted. Even some plan views may be designated by hatching for easy understanding.

Preferred Embodiments

Figure 2:
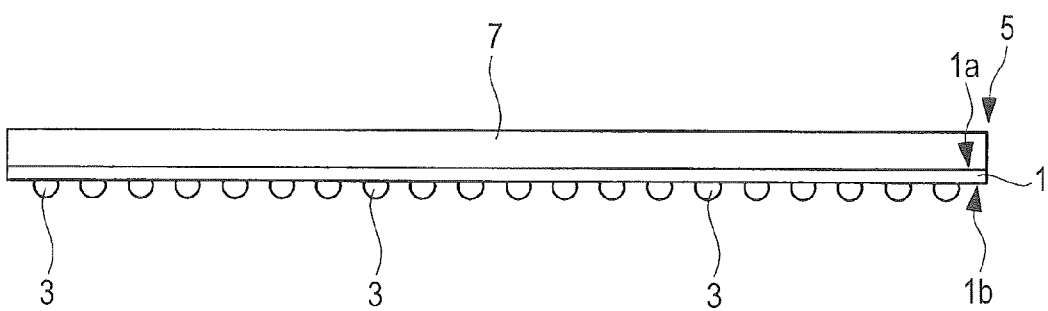
FIG. 2 is a side view showing the structure of the semiconductor device in the longitudinal direction thereof shown in FIG. 1.
Figure 3:
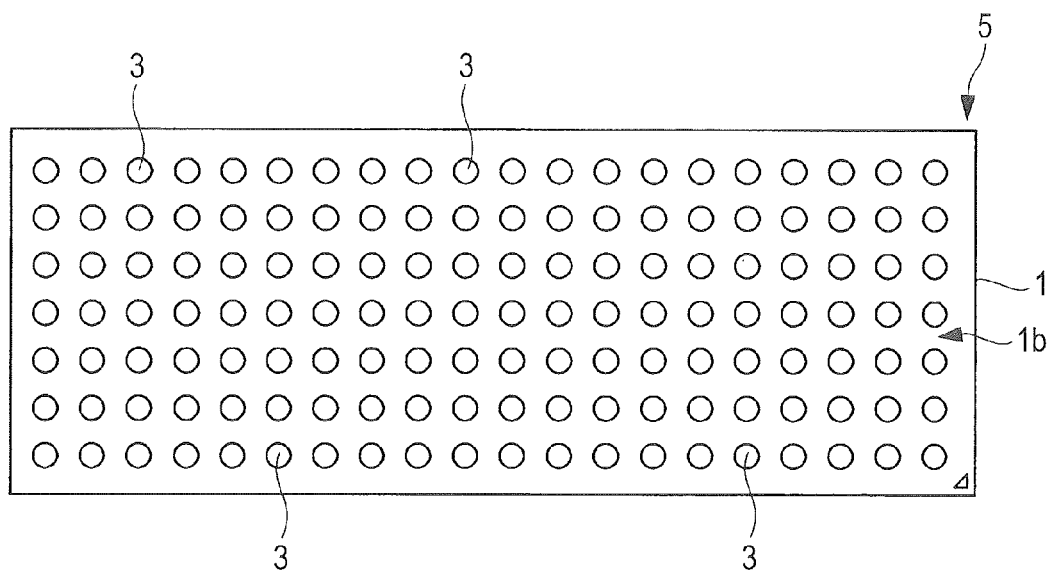
FIG. 3 is a backside view showing the backside structure of the semiconductor device shown in FIG. 1.
Figure 4:
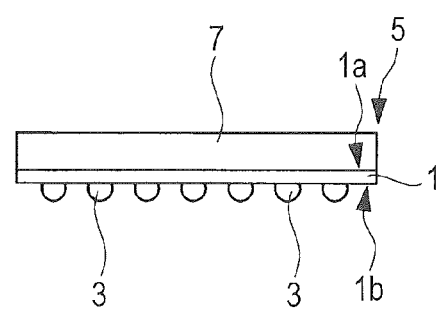
FIG. 4 is a side view showing the structure of the semiconductor device in the width direction thereof shown in FIG. 1.
Figure 5:
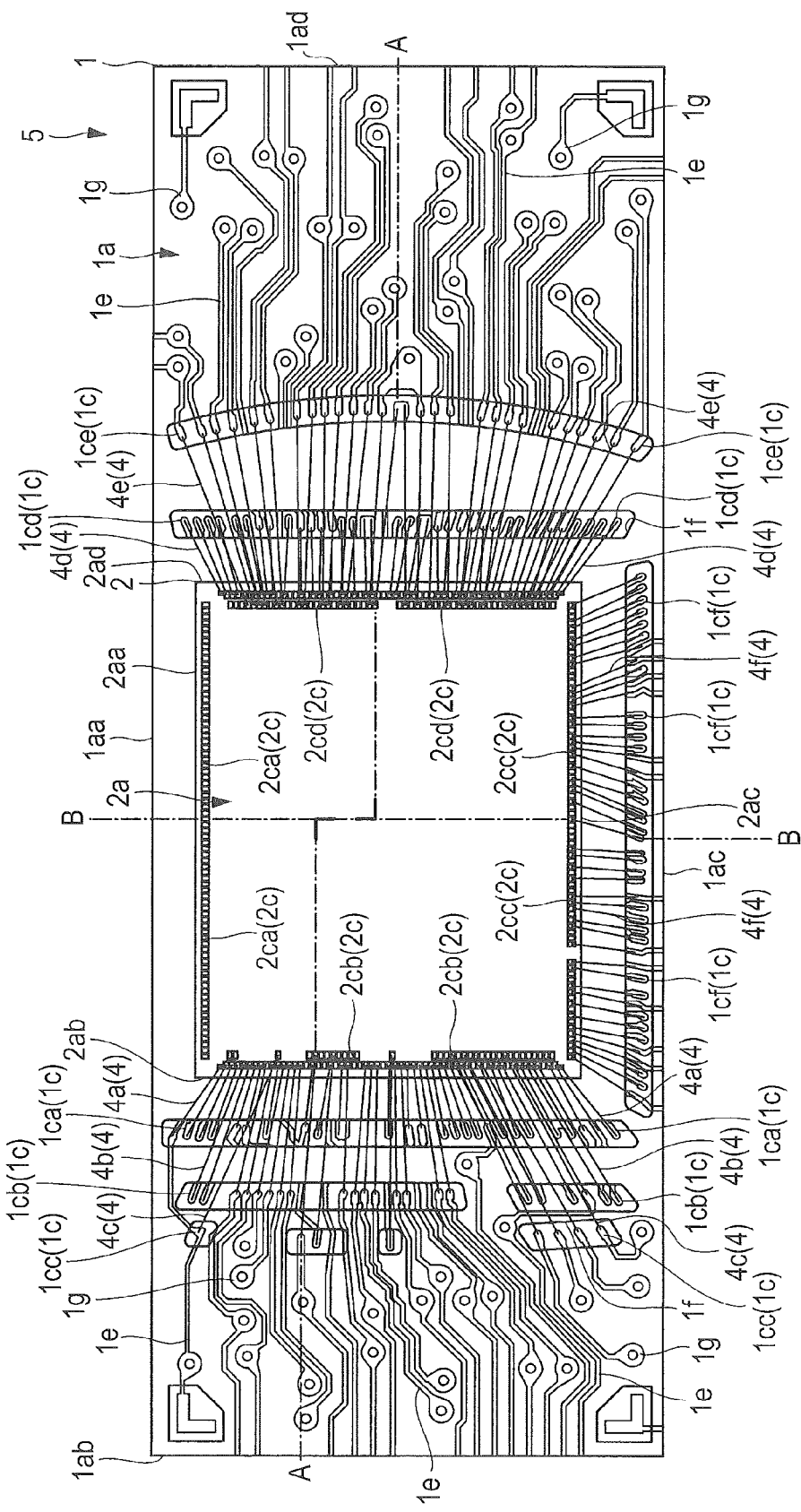
FIG. 5 is a plan view showing the internal structure of the semiconductor device shown in FIG. 1 seen through a seal body.
Figure 6:
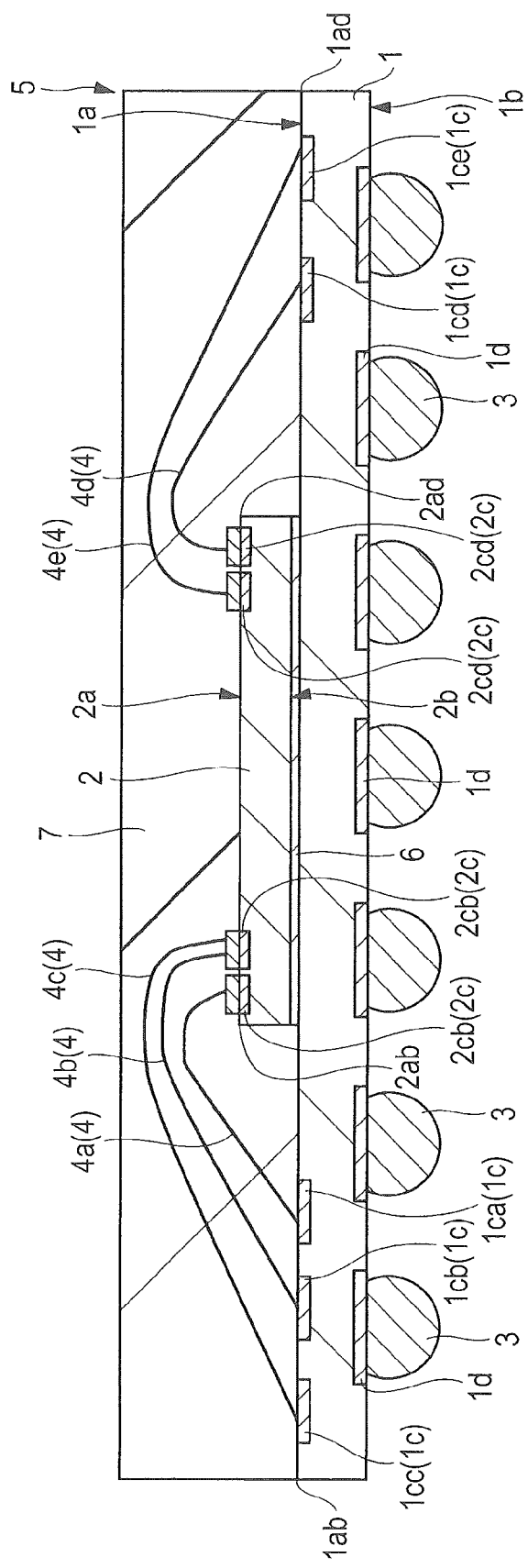
FIG. 6 is a cross-sectional view taken along the line A-A of FIG. 5.
Figure 7:
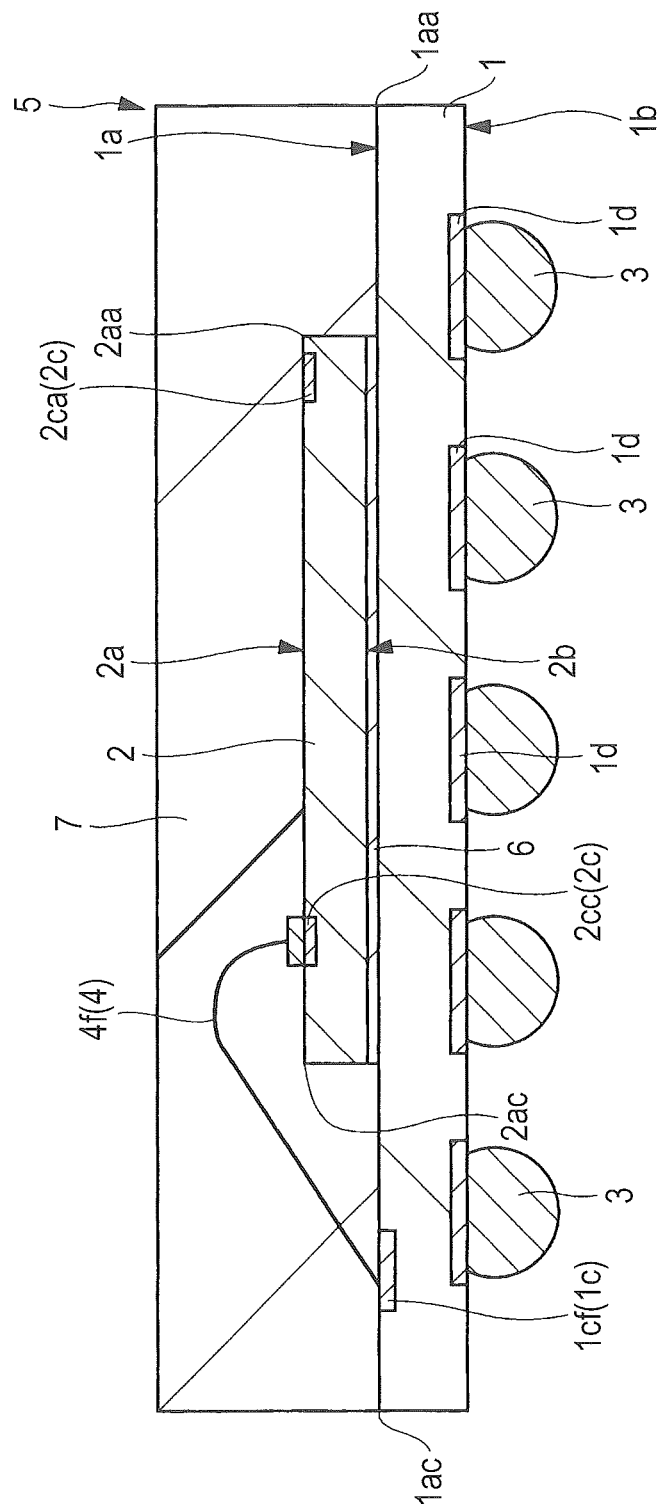
FIG. 7 is a cross-sectional view taken along the line B-B of FIG. 5.
Figure 8:
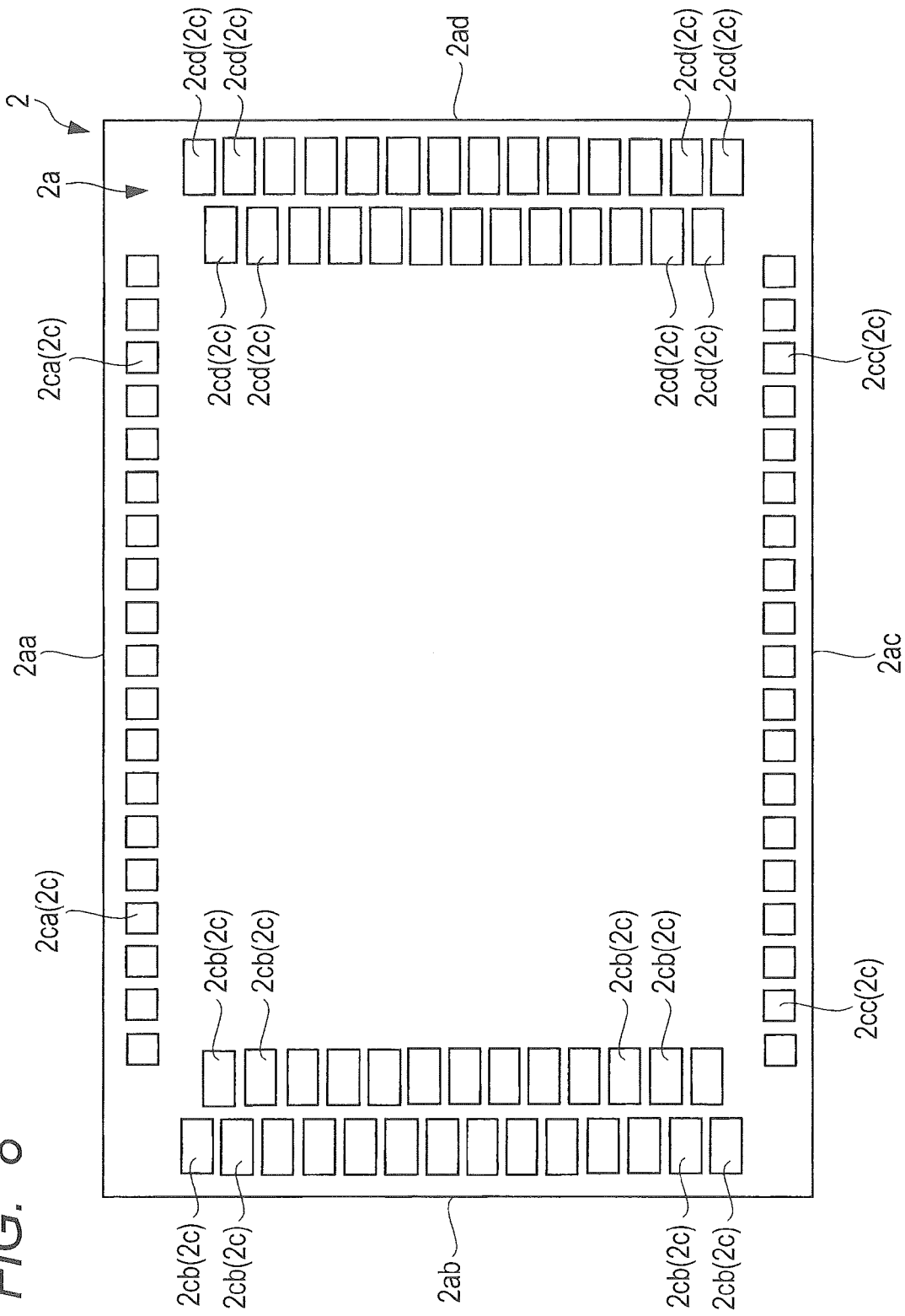
FIG. 8 is a plan view showing one example of a pad layout of a semiconductor chip mounted on the semiconductor device shown in FIG. 1.
Figure 9:
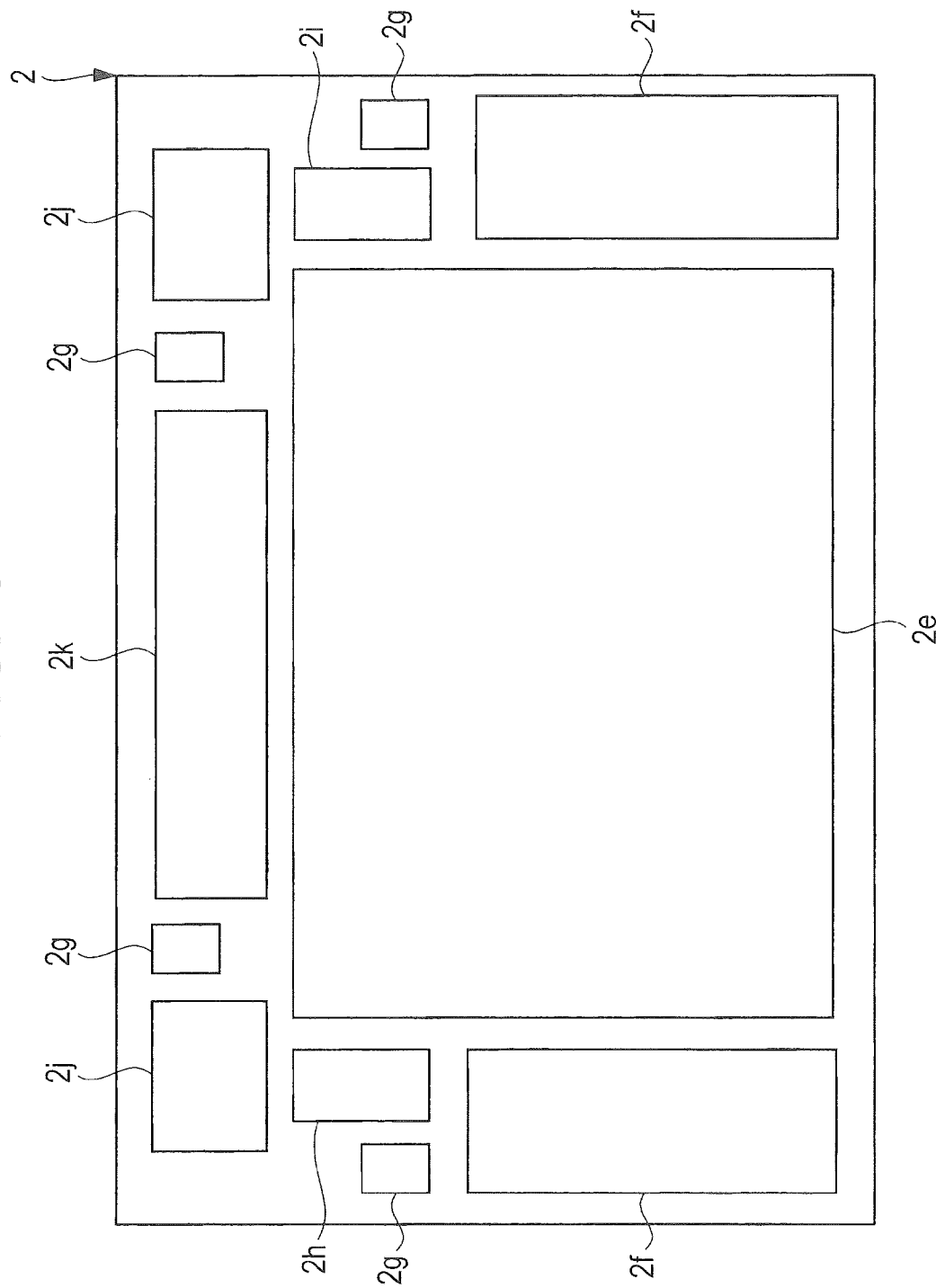
FIG. 9 is a plan view showing one example of a layout of a circuit block inside the semiconductor chip mounted on the semiconductor device shown in FIG. 1.

FIG. 1 is a plan view showing one example of the structure of a semiconductor device according to this embodiment of the invention, FIG. 2 is a side view showing the structure of the semiconductor device in the longitudinal direction thereof shown in FIG. 1, FIG. 3 is a backside view showing the backside structure of the semiconductor device shown in FIG. 1, and FIG. 4 is a side view showing the structure of the semiconductor device in the width direction thereof shown in FIG. 1. FIG. 5 is a plan view showing the internal structure of the semiconductor device shown in FIG. 1 seen through a seal body, FIG. 6 is a cross-sectional view taken along the line A-A of FIG. 5, and FIG. 7 is a cross-sectional view taken along the line B-B of FIG. 5. Further, FIG. 8 is a plan view showing one example of a pad layout of a semiconductor chip mounted on the semiconductor device shown in FIG. 1, and FIG. 9 is a plan view showing one example of a layout of a circuit block inside the semiconductor chip mounted on the semiconductor device shown in FIG. 1.

The semiconductor device of this embodiment shown in FIGS. 1 to 7 is a semiconductor package in which a semiconductor chip is mounted over a package substrate as a wiring substrate and electrically coupled to the package substrate by metal wires.

In this embodiment, the case where ball electrode disposed at the lower surface of the wiring substrate serve as terminals for external coupling by way of the semiconductor device will be described. Thus, the semiconductor device described in this embodiment is also a ball grid array (BGA) type semiconductor package.

The semiconductor device of this embodiment has the semiconductor chip and the metal wires sealed with resin by resin mold.

The BGA 5 structure as the semiconductor device of this embodiment will be described below using FIGS. 1 to 7. The BGA 5 is mounted on, for example, a tablet personal computer or a mobile terminal device (electronic device), such as a cellular phone.

Thus, in many cases, when being mounted on a display unit or the like of the electronic device, the semiconductor device is mounted on an elongated mounting substrate accommodated at the margin of a main body of the display unit, such as a liquid crystal panel.

As shown in FIG. 1, the BGA 5 of this embodiment has its outer appearance with an elongated rectangular shape in the planar view so as to be mountable on an elongated narrow mounting substrate. That is, the wiring substrate (package substrate) 1 has an elongated rectangular shape in the planar view. A semiconductor chip 2 is mounted over an upper surface 1a of the rectangular wiring substrate 1.

The wiring substrate 1 has the upper surface (first surface, front surface) 1a, and a lower surface (second surface, back surface) 1b opposite thereto. As shown in FIG. 5, a plurality of bonding leads (terminals, electrodes, leads, bonding stitch) 1c is provided over the upper surface 1a with the semiconductor chip 2 mounted thereover to be electrically coupled to the semiconductor chip 2 via metal wires 4. A plurality of wiring portions (wiring patterns) 1e electrically coupled to the bonding leads 1c is formed over the upper surface 1a.

Figure 10:
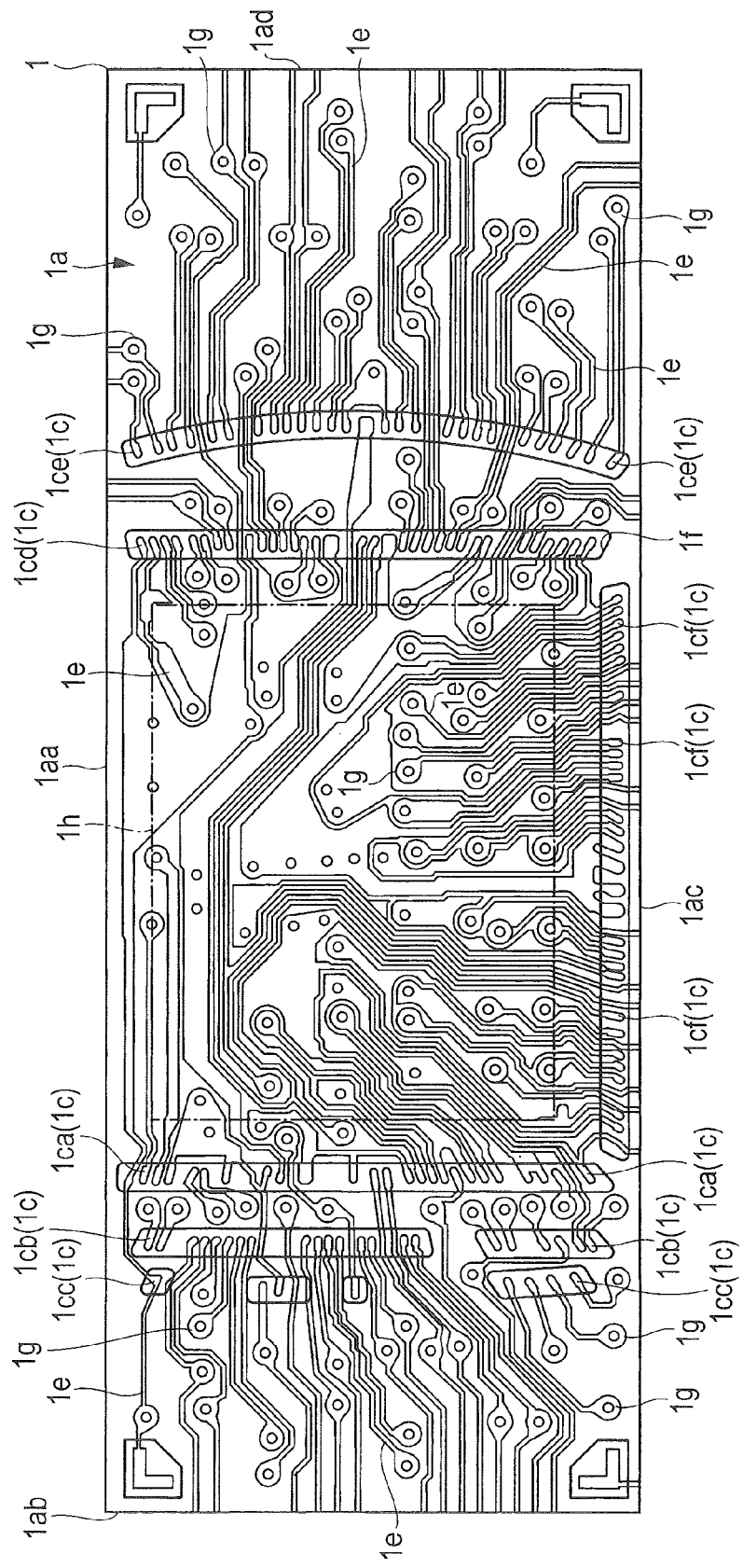
FIG. 10 is a plan view showing one example of the structure of an upper surface of a wiring substrate to be used for assembly of the semiconductor device shown in FIG. 1.

Each wiring portion 1e extends outward or inward from each bonding lead 1c (toward a region under the chip, or a chip mounting region 1h shown in FIG. 10), leading to a through hole wiring 1g. As shown in FIG. 6, the wiring portion 1e is electrically coupled to each land 1d on the lower surface 1b side via the through hole wiring 1g.

As shown in FIG. 5, the upper surface 1a of the wiring substrate 1 is formed in an elongated rectangular shape with a first side 1aa and a third side 1ac as a pair of opposed long sides, and a second side 1ab and a fourth side 1ad intersecting the first and third sides 1aa and 1ac as a pair of opposed short sides.

As shown in FIGS. 2 to 4, a plurality of solder balls (terminals for external coupling, external electrode terminals) 3 are arranged over the lower surface 1b of the wiring substrate 1 in a grid pattern. As shown in FIGS. 6 and 7, the respective solder balls 3 are provided on a plurality of lands (terminals, electrodes, leads) 1d disposed at the lower surface 1b of the wiring substrate 1.

The bonding leads 1c on the upper surface 1a are electrically coupled to the lands 1d on the lower surface 1b via the wiring portions (wiring patterns) 1e formed on the upper surface 1a and the through hole wirings 1g or the like leading from the upper surface 1a to the lower surface 1b.

As shown in FIG. 5, the bonding leads 1c formed at the upper surface 1a of the wiring substrate 1 are provided to be exposed at openings if of an insulating film (solder resist film) on the upper surface 1a.

The semiconductor chip 2 has a quadrilateral shape with a main surface (front surface) 2a and a back surface 2b opposite thereto. A plurality of electrode pads (electrodes, terminals) 2c are formed at the main surface 2a. Specifically, the main surface 2a is formed in a substantially square planar shape with a first side 2aa and a third side 2ac as a pair of opposed long sides, and a second side 2ab and a fourth side 2ad as a pair of opposed short sides intersecting the first side 2aa and the third side 2ac, respectively. In this embodiment, the case where the main surface 2a of the semiconductor chip 2 is substantially square will be described below.

As shown in FIG. 8, the electrode pads 2c are provided along the peripheral edge (outer periphery) of the main surface 2a of the semiconductor chip 2.

As shown in FIGS. 6 and 7, the semiconductor chip 2 is bonded to the wiring substrate 1 via die bonding material (mounting material, adhesive) 6. That is, the back surface 2b of the semiconductor chip 2 is bonded to the upper surface 1a of the wiring substrate 1 via the die bonding material 6. The die bonding material 6 is, for example, a resin adhesive or the like.

As shown in FIGS. 5 to 7, the bonding leads 1c on the upper surface 1a of the wiring substrate 1 are electrically coupled to the electrode pads 2c of the semiconductor chip 2 via the metal wires (conductive wires, conductive members) 4.

Thus, in the BGA 5, the respective electrode pads 2c of the semiconductor chip 2 are electrically coupled to the solder balls 3 serving as the terminal for external coupling via the metal wire 4, the bonding leads 1c of the wiring substrate 1, the wiring portions 1e, and the through hole wirings 1g, and the lands 1d.

The metal wire 4 is formed, for example, of a gold wire, a copper wire, or the like.

As shown in FIGS. 2 and 4, the BGA 5 includes a seal body (resin member, resin portion) 7 formed of resin 9 (see FIG. 15) for sealing over the upper surface 1a of the wiring substrate 1. The semiconductor chip 2 and the metal wires 4 are sealed with resin by the seal body 7. The seal body 7 is formed, for example, of thermosetting epoxy resin or the like.

As shown in FIG. 1, an index mark 7a is formed on the surface of the seal body 7.

Now, the semiconductor chip 2 mounted over the BGA 5 will be described.

As shown in FIG. 9, the semiconductor chip 2 of this embodiment is a composite type with a memory circuit and a logic circuit. Specifically, the semiconductor chip 2 has a dynamic random access memory (DRAM, memory circuit) 2e, and a plurality of logic circuits 2f, 2g, 2h, 2i, and 2j formed therein. That is, the semiconductor chip 2 is a semiconductor device including a combination of the plurality of logic circuits and the DRAM 2e within one chip.

Each of the logic circuits 2f, 2g, 2h, 2i, and 2j is, for example, a processor, a frequency negative feedback circuit, and the like. As shown in FIG. 9, the region of the DRAM 2e in the chip has a substantially square shape, and occupies most of the chip area without being divided into two or more regions. This is because the DRAM 2e is formed to have one large shape similar to a square shape, which can improve the area efficiency and design efficiency. In the surroundings of the DRAM 2e, the logic circuits 2f, 2g, 2h, 2i, and 2j having specific functions (subjected to macro processing) and another logic circuit 2k (not subjected to macro processing) are formed, whereby the DRAM, the logic circuits, and the electrode pads 2c are coupled together via metal wirings formed in the semiconductor chip.

As a result, the main surface 2a of the semiconductor chip 2 has a rectangular shape substantially similar to a square shape, with a relatively large area.

The semiconductor chip 2 is the composite one including a combination of the DRAM 2e and the logic circuits 2f, 2g, 2h, 2i, 2j and 2k. Referring to FIG. 8, the electrode pads 2c are formed at the peripheral edge of the rectangular main surface 2a along the four respective sides thereof. Thus, the semiconductor chip is a chip having a relatively large number of pads.

As mentioned above, the BGA 5 of this embodiment is provided on the condition that the planar shape of the wiring substrate 1 is elongated rectangular, and the planar shape of the semiconductor chip 2 to be mounted is similar to square (or rectangular). That is, the structural conditions for the BGA 5 are limited by restrictions on shape of the wiring substrate 1, shape of the semiconductor chip 2, and the number of electrode pads of the semiconductor chip 2.

As shown in FIG. 5, in the BGA 5 of this embodiment, at the rectangular upper surface 1a of the wiring substrate 1, a pair of opposed long sides of the main surface 2a of the semiconductor chip 2 (first side 2aa, and third side 2ac) are arranged along the long sides (first side 1aa, third side 1ac) of the upper surface 1a of the wiring substrate 1. At this time, the semiconductor chip 2 is arranged close to one end in the width direction (direction along the short side) of the rectangular upper surface 1a of the wiring substrate 1. In other words, one long side (first side 2aa) of the semiconductor chip 2 is positioned close to one long side (first side 1aa) side of the wiring substrate 1.

The electrode pads 2c are formed at the peripheral edges of four respective sides of the main surface 2a of the semiconductor chip 2. To the electrode pads 2c formed along three sides among the electrode pads 2c at the four sides, the metal wires (bonding wires) 4 can be coupled.

That is, in the BGA 5 of this embodiment, the first side 2aa among the four sides of the main surface 2a of the semiconductor chip 2 is arranged close to the end of the wiring substrate 1 beside the first side 1aa of the wiring substrate 1, so that the wire bonding can be performed on the three sides of the main surface 2a of the semiconductor chip 2. As a result, among the first side 2aa and the third side 1ac as one pair of opposed long sides of the main surface 2a of the semiconductor chip 2, all the respective electrode pads 2c formed at the peripheral edge along the first side 2aa of the main surface 2a cannot be coupled to the metal wire 4.

By making effective use of the longitudinal direction (the direction along the first side 1aa and the third side 1ac as the long side) of the rectangular upper surface 1a of the wiring substrate, the wire bonding is performed on both sides of the respective second side 2ab and fourth side 2ad as a short side of the semiconductor chip 2 such that the loop height of the metal wires 4 is changed in stages. Thus, even the semiconductor chip 2 with relatively many pads can be coupled electrically to the wiring substrate 1.

As mentioned above, the structure of the BGA 5 of this embodiment can be achieved by performing wire bonding on three sides of the semiconductor chip 2 so as to meet the above restrictions on shape of the wiring substrate 1 and the above restrictions on shape of the semiconductor chip 2 including the number of pads.

Here, the layout of the bonding leads (leads) 1c formed on the upper surface 1a of the wiring substrate 1 will be described in detail.

As shown in FIG. 5, in the BGA 5, the bonding leads 1c are arranged in lines in positions of the wiring substrate 1 outside the second and fourth sides 2ab and 2ad as the opposed short sides of the semiconductor chip 2 in parallel to the second and fourth sides 1ab and 1ad as the short sides of the upper surface 1a. The bonding leads 1c are electrically coupled to a plurality of metal wires 4.

Thus, the metal wires 4 disposed along the long sides (first side 1aa and third side 1ac) of the upper surface 1a of the wiring substrate 1 are respectively arranged at two opposed sides (second side 2ab and fourth side 2ad) of the main surface 2a of the semiconductor chip 2. Further, the metal wires 4 are also arranged at the third side 2ac as the long side of the main surface 2a of the semiconductor chip 2.

That is, in the BGA 5, the metal wires 4 are arranged over the respective second side 2ab (short side), third side 2ac (long side), and fourth side 2ad (short side) of the main surface 2a of the semiconductor chip 2. In other words, the metal wires 4 are arranged at the second side 2ab (short side), third side 2ac (long side), and fourth side 2ad (short side), respectively, to straddle each of the sides.

Specifically, the bonding leads 1c are provided in lines outside the two respective opposed sides of the main surface 2a of the semiconductor chip 2 along the short sides (second side 1ab, and fourth side 1ad) of the upper surface 1a. In the BGA 5 shown in FIG. 5, the bonding leads 1c are provided in three lines along the second side 1ab of the wiring substrate 1 outside the second side 2ab of the semiconductor chip 2, and the bonding leads 1c are provided in two lines along the fourth side 1ad of the wiring substrate 1 outside the fourth side 2ad of the semiconductor chip 2.

The metal wires 4 are coupled between the bonding leads 1c and the electrode pads 2c of the semiconductor chip 2. As shown in FIG. 6, the loop height of the metal wire 4 coupled varies every line of the bonding leads 1c.

That is, in either of the second and fourth sides 2ab and 2ad of the main surface 2a of the semiconductor chip 2, as the line of the bonding leads 1c along the short side (second side 1ab and fourth side 1ad) of the wiring substrate 1 is farther (spaced) away from the semiconductor chip 2, the wire bonding is performed such that the loop height of the metal wire 4 becomes higher.

Thus, in the BGA 5 shown in FIGS. 5 and 6, the metal wires 4 disposed beside the second side 2ab of the semiconductor chip 2 are arranged to have three kinds (three stages) of loop heights because of the three lines of the bonding leads 1c (bonding leads 1ca, 1cb, and 1cc).

Specifically, on a side of the second side 2ab of the semiconductor chip 2, the loop height of the first wire (metal wire 4) 4a coupled to the bonding lead 1ca is lowest, the loop height of the third wire (metal wire 4) 4c coupled to the bonding lead 1cc is highest, and the loop height of the second wire (metal wire 4) 4b coupled to the bonding lead 1cb is an intermediate one.

On the other hand, the metal wires 4 disposed beside the fourth side 2ad of the semiconductor chip 2 are arranged to have two kinds (two stages) of loop heights because of the two lines of the bonding leads 1c (bonding leads 1cd, and 1ce).

Specifically, on a side of the fourth side 2ad of the semiconductor chip 2, the loop height of the fifth wire (metal wire 4) 4e coupled to the bonding lead 1ce is higher than that of the fourth wire (metal wire 4) 4d coupled to the bonding lead 1cd.

Thus, the wire loops are formed in multiple stages (with a plurality of loop heights), which can prevent the occurrence of electric short circuit between the metal wires respectively coupled to the lines of the bonding leads 1c formed in lines.

In the semiconductor chip 2 as shown in FIG. 8, the electrode pads 2cb and 2cd formed on the main surface 2a along the two opposed short sides (second side 2ab and fourth side 2ad) of the main surface 2a are disposed in a staggered arrangement. By placing the electrode pads 2c in the staggered arrangement, the number of electrode pads at the edges of the short sides (second side 2ab and fourth side 2ad) of the main surface 2a of the semiconductor chip 2 can be increased.

In bonding the metal wires 4 in the multiple stages, the staggered arrangement can displace each pad position by half a pitch, thereby preventing the interference between the metal wires (electric short circuit).

As shown in FIG. 5, the metal wires 4 are arranged beside the third side 2ac as one long side intersecting the two opposed sides (second side 2ab and fourth side 2ad as a short side) of the main surface 2a of the semiconductor chip 2. That is, the electrode pads 2cc (2c) are disposed in one line along the peripheral edge of the third side 2ac as one long side of the main surface 2a of the semiconductor chip shown in FIG. 8. On the other hand, in response to the electrode pads 2cc of the semiconductor chip 2, the bonding leads 1cf (1c) are provided in one line at the upper surface 1a of the wiring substrate 1 along the third side 1ac as the long side of the upper surface 1a, outside one side (third side 2ac) intersecting the two opposed short sides of the semiconductor chip 2.

As shown in FIGS. 5 and 7, the electrode pads 2cc (2c) formed along the third side (long side) 2ac of the main surface 2a of the semiconductor chip 2 are electrically coupled to the bonding leads 1cf on the upper surface 1a of the wiring substrate 1 positioned outside the third side 2ac of the semiconductor chip 2 via a plurality of sixth wires (metal wires 4) 4f.

As mentioned above, the bonding leads 1c are laid out in one, two, and three lines for respective sides of a chip mounting portion (chip mounting region 1h shown in FIG. 10) at the upper surface 1a of the wiring substrate 1, whereby the wire bonding is performed on the three sides (second side 2ab, third side 2ac, and fourth side 2ad) of the main surface 2a of the semiconductor chip 2 (three-sided bonding).

On a side of the third side 2ac of the two opposed long sides of the main surface 2a of the semiconductor chip 2 as a long side with the metal wires 4 formed thereon, the wiring portion 1e as the wiring pattern is not formed outside the line of the bonding leads 1cf (1c) positioned beside the third side 2ac of the semiconductor chip 2 at the upper surface 1a of the wiring substrate 1 of the wiring portion 1e.

That is, as shown in FIG. 10 to be described later, the bonding leads 1cf provided along the third side (long side) 1ac of the wiring substrate 1 extend toward the inner region (chip mounting region 1h) and not toward the outer region of the arrangement, and are electrically coupled to the lower surface side lands 1d shown in FIG. 11 via the through hole wirings 1g in the inner region.

In the BGA 5, the electrode pads (first electrode pads) 2ca (2c) are formed at the main surface 2a along the first side (long side) 2aa not having the metal wires 4 disposed therein, among the sides of the rectangular main surface 2a of the semiconductor chip 2. Any one of these electrode pads 2ca is not coupled to the metal wire 4. In other words, the three-sided bonding is performed, so that the metal wire 4 is not coupled to the electrode pads 2ca formed at the peripheral edge of the first side 2aa of the main surface 2a of the semiconductor chip 2.

The electrode pads 2ca (2c) to which the metal wire 4 at the first side 2aa of the semiconductor chip 2 is not coupled are electrically coupled to a protective circuit formed inside the semiconductor chip 2.

That is, each of the electrode pads 2ca formed along the one side (first side 2aa) not subjected to the wire bonding at the main surface 2a of the semiconductor chip 2 is a dummy electrode pad electrically coupled to the protective circuit (power source) within the chip.

This can reduce electrostatic breakdown (or stabilize resistance to electrostatic breakdown).

As mentioned above, in the BGA 5 of this embodiment, the semiconductor chip 2 having the substantially square planar shape is mounted over the elongated rectangular wiring substrate 1, the metal wires 4 are arranged at three sides of the main surface 2a of the semiconductor chip 2, and the metal wires 4 respectively disposed at two short sides of the semiconductor chip 2 are set to have different kinds of loop heights, so that the three-sided bonding can be performed on the substantially square semiconductor chip 2.

Thus, in the structure having the semiconductor chip 2 with a substantially square planar shape mounted over the elongated rectangular wiring substrate 1, the three-sided bonding can be applied to mount the semiconductor chip 2 with the substantially square shape over the elongated wiring substrate 1. Additionally, the semiconductor chip 2 with many electrode pads can be mounted, which can achieve the BGA (semiconductor device) 5 with the above-mentioned structure.

That is, even the semiconductor device with restrictions on planar shape of the wiring substrate 1, restrictions on planar shape of the semiconductor chip 2, and restrictions on the number of the electrode pads 2c can achieve the structure required.

In other words, even under the restrictions on layout on the mounting substrate side, such as a circuit substrate for mounting the semiconductor device (BGA 5), this embodiment can achieve the semiconductor device (BGA 5) that can be mounted over the mounting substrate while complying with restrictions on layout on the mounting substrate side.

Next, a manufacturing method of the BGA (semiconductor device) 5 of this embodiment will be described.

Figure 11:
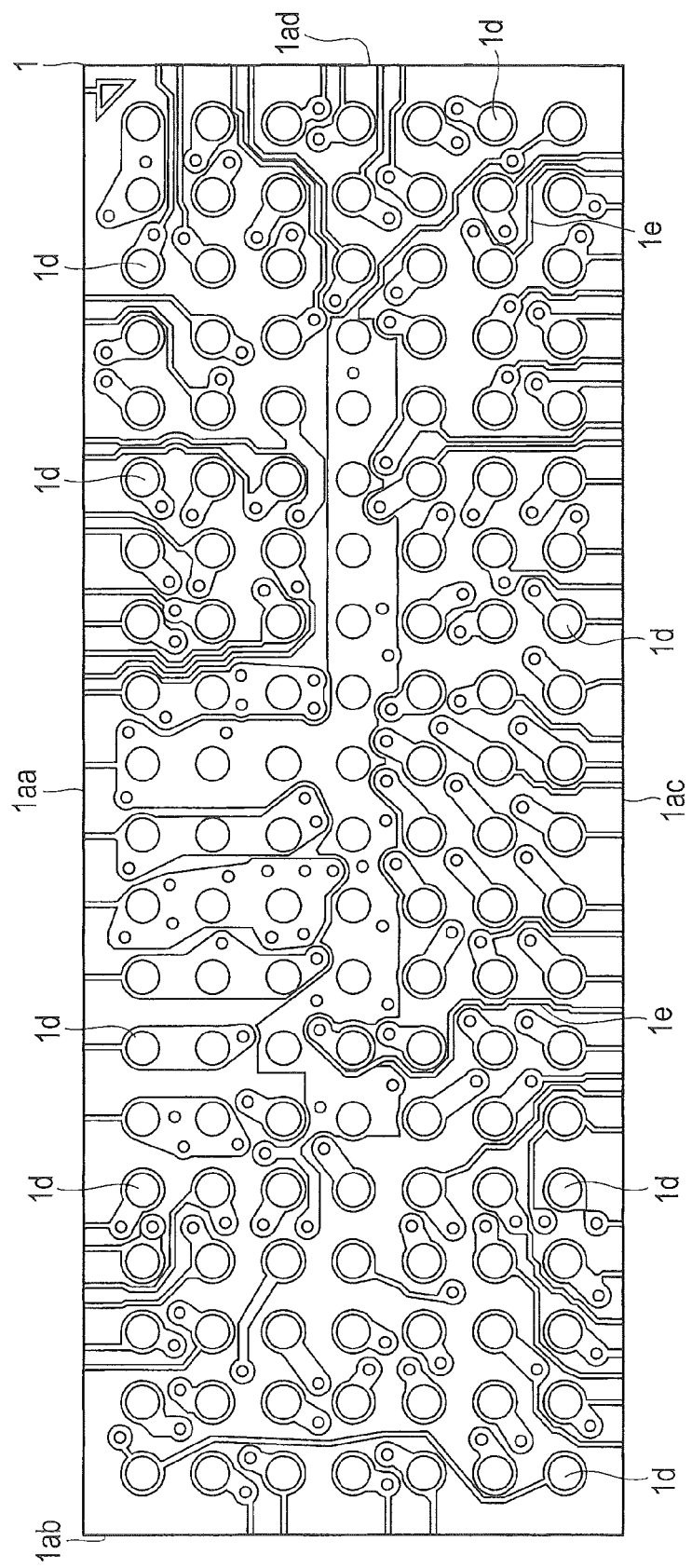
FIG. 11 is a plan view observed from the above of wiring patterns on the lower surface side of the wiring substrate shown in FIG. 10 by way of example.
Figure 12:
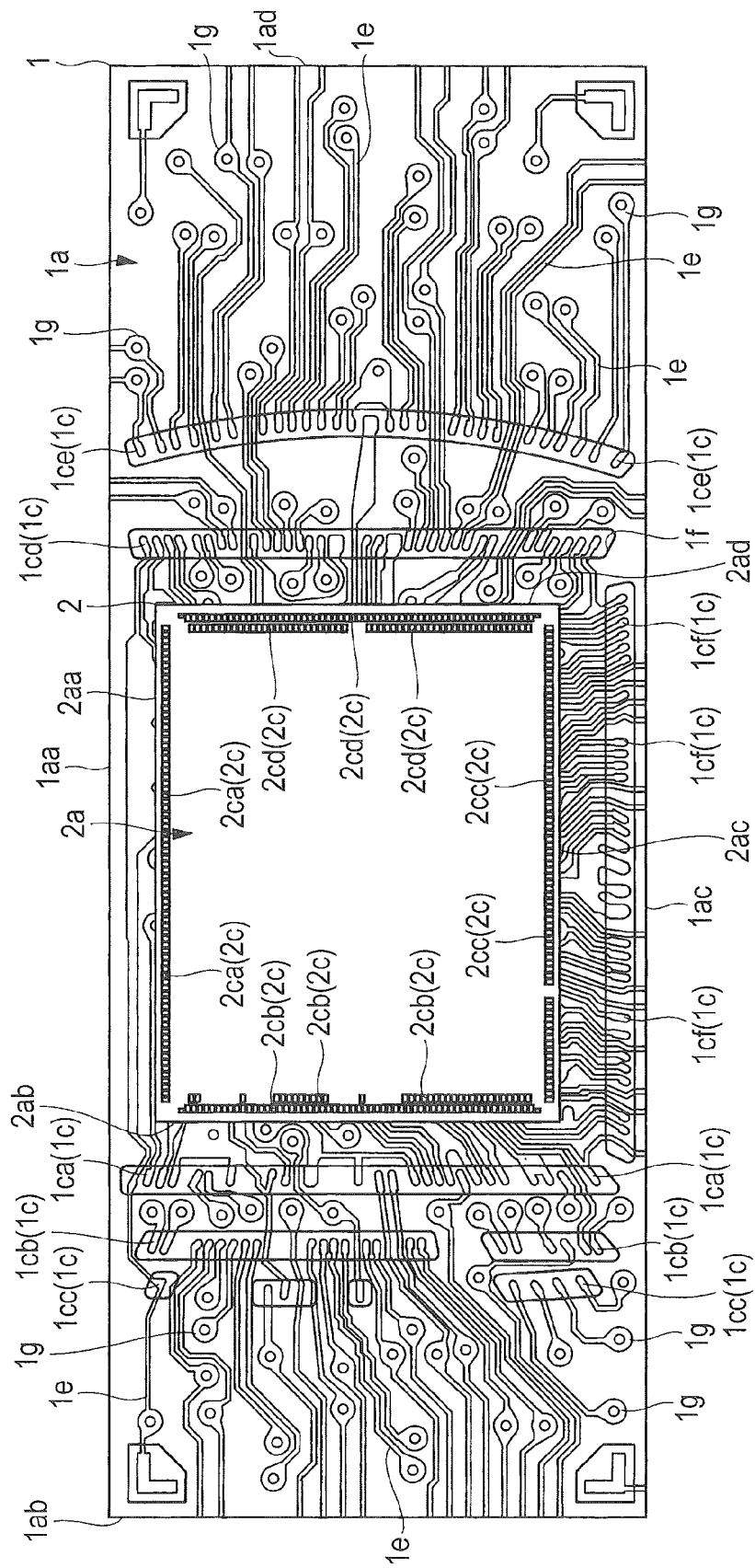
FIG. 12 is a plan view showing one example of the structure obtained after die bonding in the assembly of the semiconductor device shown in FIG. 1.
Figure 13:
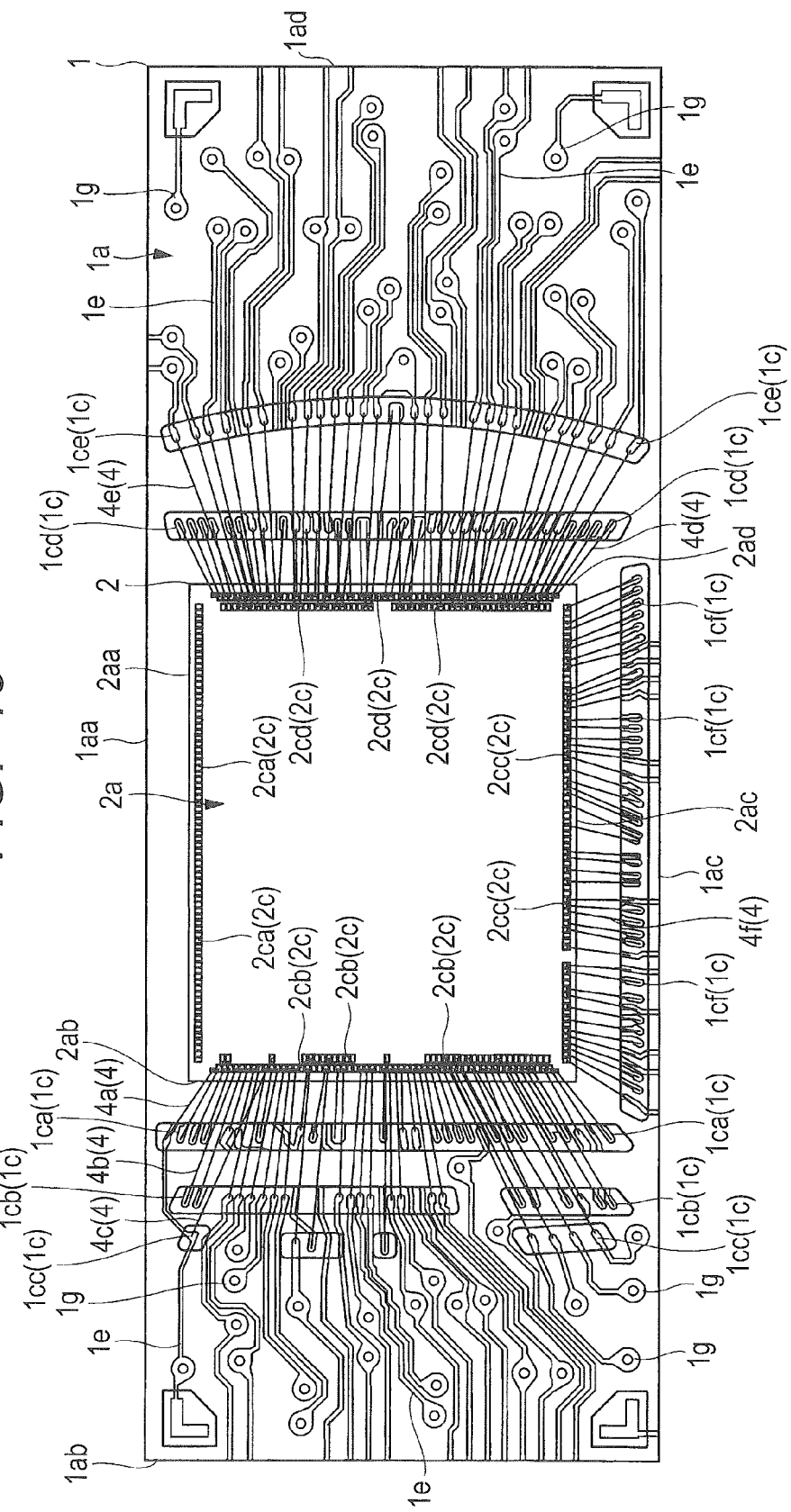
FIG. 13 is a plan view showing one example of the structure obtained after wire bonding in the assembly of the semiconductor device shown in FIG. 1.
Figure 14:
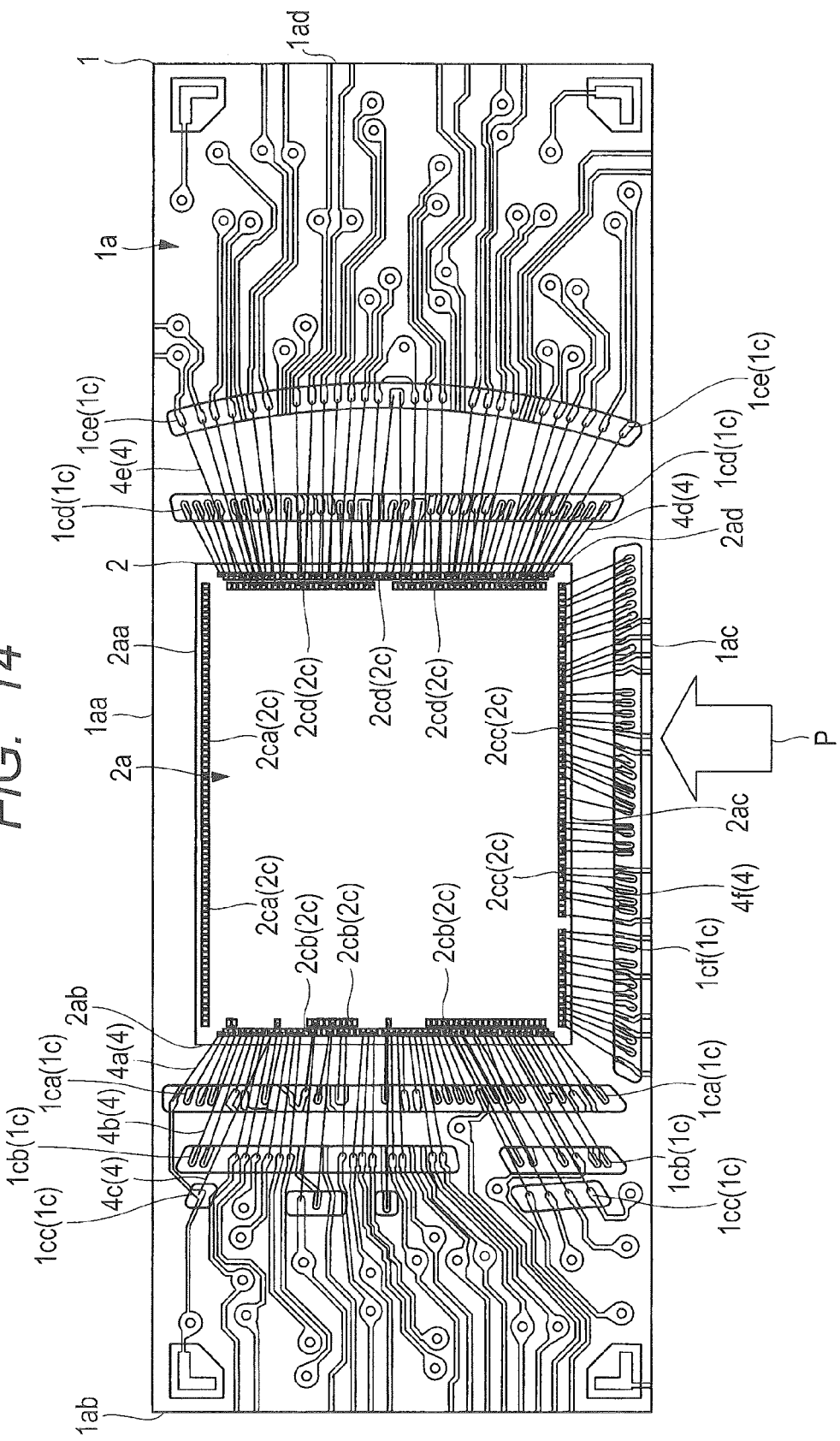
FIG. 14 is a plan view showing one example of a direction of charging resin in a resin molding step in the assembly of the semiconductor device shown in FIG. 1.

FIG. 10 is a plan view showing one example of the structure of an upper surface of a wiring substrate to be used for assembly of the semiconductor device shown in FIG. 1, FIG. 11 is a perspective plan view seen from the above of wiring patterns on the lower surface side of the wiring substrate shown in FIG. 10 by way of example, FIG. 12 is a plan view showing one example of the structure obtained after die bonding in the assembly of the semiconductor device shown in FIG. 1, and FIG. 13 is a plan view showing one example of the structure obtained after wire bonding in the assembly of the semiconductor device shown in FIG. 1. Further, FIG. 14 is a plan view showing one example of a direction of charging resin in a resin molding step in the assembly of the semiconductor device shown in FIG. 1, and FIG. 15 is a plan view showing one example of the state of charged resin in the resin molding step in the assembly of the semiconductor device shown in FIG. 1.

Figure 15:
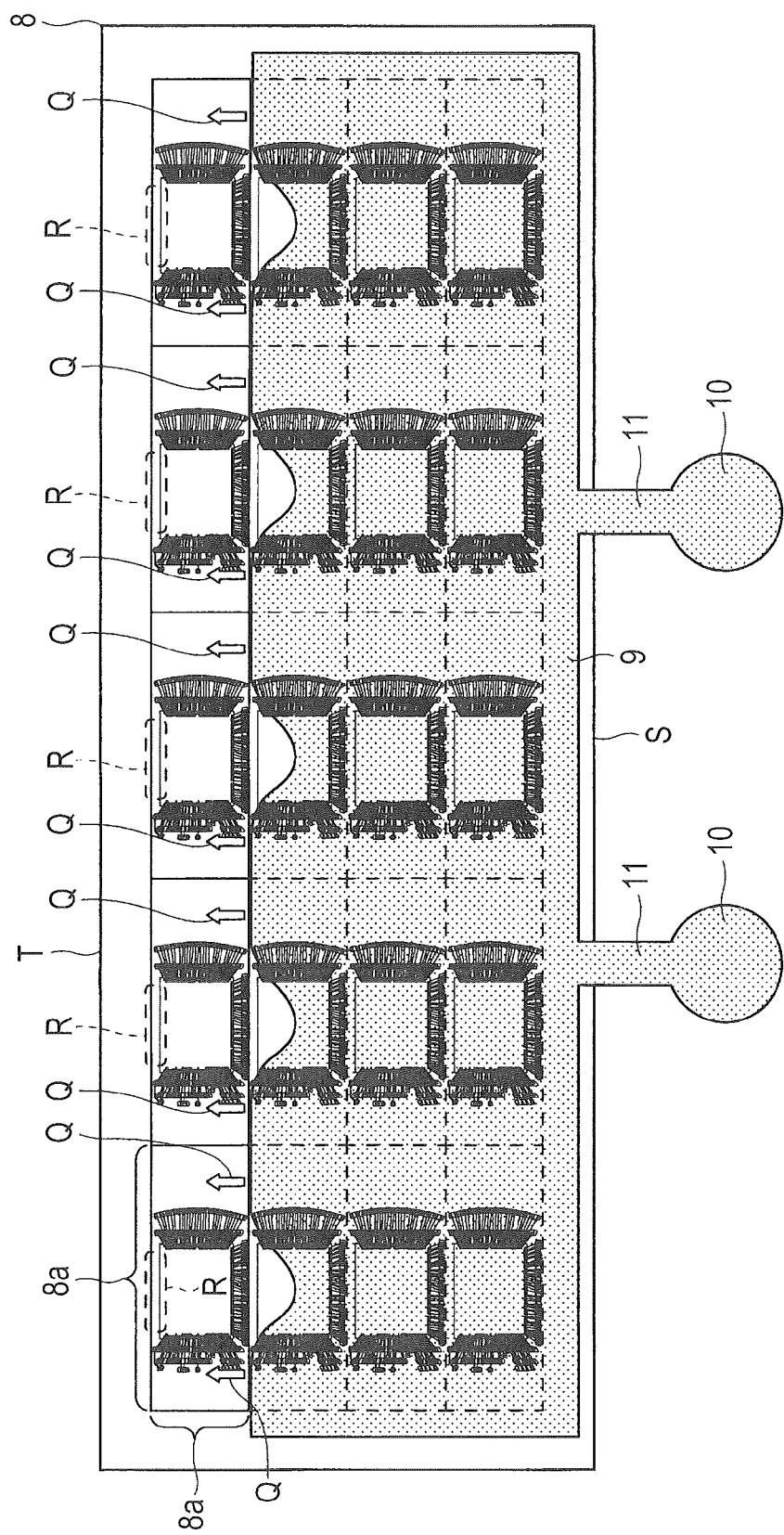
FIG. 15 is a plan view showing one example of the state of the charged resin in the resin molding step in the assembly of the semiconductor device shown in FIG. 1.

First, a multi-piece substrate 8 shown in FIG. 15 is provided. The multi-piece substrate 8 has a plurality of device regions (package regions, semiconductor device regions) 8a in each of which the BGA 5 can be formed, and which are partitioned off. In this embodiment, for simplifying the description, the assembly of the BGA 5 will be described below by taking only one device region 8a (wiring substrate 1) as an example.

First of all, as shown in FIGS. 10 and 11, the wiring substrate 1 is provided which has the upper surface 1a with a rectangular shape and the lower surface 1b opposite thereto. The bonding leads 1c are disposed in the surroundings of the three sides of the chip mounting region 1h on the upper surface 1a.

The bonding leads 1c formed around the chip mounting region 1h on the upper surface 1a of the wiring substrate 1 are respectively disposed along the three sides of the quadrilateral chip mounting region 1h. The bonding leads 1c are laid out in one line, two lines, and three lines for the respective three sides of the chip mounting region 1h.

The bonding leads 1c are provided along the second side 1ab in three lines (bonding leads 1ca, 1cb, and 1cc) in a region between the chip mounting region 1h and the second side (short side) 1ab of the wiring substrate 1. On the other hand, the bonding leads 1c are provided along the fourth side 1ad in two lines (bonding leads 1cd, and 1ce) in a region between the chip mounting region 1h and the fourth side (short side) 1ad.

Further, the bonding leads 1cf are provided along the third side 1ac in one line in a region between the chip mounting region 1h and the third side (long side) 1ac.

As shown in FIG. 11, a plurality of lands 1d are formed in parallel in a grid pattern on the lower surface side of the wiring substrate 1. The bonding leads 1c on the upper surface side are electrically coupled to the lands 1d on the lower surface side via the wiring portions 1e formed on the upper surface 1a and the lower surface 1b, and the through hole wirings 1g.

The shape of the appearance (planar shape) of the wiring substrate 1 in a planar view is elongated rectangular such that the BGA 5 is mountable on the elongated narrow mounting substrate.

Thereafter, die bonding is performed. At this time, the semiconductor chip 2 having the quadrilateral main surface 2a, the pads 2c formed at the main surface 2a, and the back surface 2b opposite to the main surface 2a are disposed over the upper surface 1a of the wiring substrate 1 such that the back surface 2b of the semiconductor chip 2 is opposed to the upper surface 1a of the wiring substrate 1.

As shown in FIG. 8, the electrode pads 2c of the semiconductor chip 2 are provided at the peripheral edges of the main surface 2a along the respective four sides of the main surface 2a. The electrode pads 2cb and 2cd formed along a pair of opposed short sides of the main surface 2a, namely, second side 2ab and fourth side 2ad, among the electrode pads 2c are disposed in a staggered arrangement.

The electrode pads 2ca and 2cc are respectively formed in one line along a pair of opposed long sides of the main surface 2a, namely, the first side 2aa and third side 2ac. The electrode pads (first electrode pads) 2ca provided at the peripheral edge along the first side 2aa as one long side are electrically coupled to the protective circuit within the chip. Thus, each of the electrode pads 2ca is a dummy electrode pad.

As shown in FIG. 9, the semiconductor chip 2 is a composite type with a memory circuit and a logic circuit. Specifically, the semiconductor chip 2 has the DRAM (memory circuit) 2e, and a plurality of logic circuits 2f, 2g, 2h, 2i, and 2j, which are formed therein. That is, the semiconductor chip 2 is a semiconductor device including a combination of the plurality of logic circuits and the DRAM 2e within one chip.

The region of the DRAM 2e in the chip has a substantially square shape, and occupies most of the chip area without being divided into two or more regions. This is because the DRAM 2e is formed to have one large shape similar to a square shape, which can improve the area efficiency and design efficiency. As a result, the main surface 2a of the semiconductor chip 2 has a rectangular shape similar to a square shape, with a relatively large area.

The semiconductor chip 2 is the composite one including a combination of the DRAM 2e and the logic circuits 2f, 2g, 2h, 2i, 2j and 2k. Referring to FIG. 8, the electrode pads 2c are formed at the periphery of the rectangular main surface 2a along the four respective sides thereof. Thus, the semiconductor chip is a chip having a relatively large number of pads.

The semiconductor chip 2 described above has the structure shown in FIG. 12 which includes the chip mounting region 1h on the upper surface 1a of the wiring substrate 1 shown in FIG. 10. At this time, as shown in FIG. 6, the semiconductor chip 2 is mounted over the upper surface 1a of the wiring substrate 1 via the die bonding material (adhesive) 6.

In the BGA 5 of this embodiment, the semiconductor chip 2 is disposed over the wiring substrate 1 such that the first side 2aa and the third side 2ac as a pair of long sides opposed to the main surface 2a of the semiconductor chip 2 extend along the first side 1aa and the third side 1ac, respectively, as a pair of long sides opposed to the upper surface 1a of the wiring substrate 1.

That is, as shown in FIG. 12, the semiconductor chip 2 is mounted over the wiring substrate 1 such that a pair of long sides (firs side 2aa, third side 2ac) of the semiconductor chip 2 extends along the opposed long sides (first side 1aa, third side 1ac) of the wiring substrate 1.

Thus, the long side of the wiring substrate 1 and the long side of the semiconductor chip 2 are arranged to extend along each other, and the short side of the wiring substrate 1 and the short side of the semiconductor chip 2 are also arranged to extend along each other.

Thereafter, wire bonding is performed. As shown in FIG. 13, the electrode pads 2c (2cb, 2cc, 2cd) formed along three of the four sides of the main surface 2a of the semiconductor chip 2, and the bonding leads 1c at the upper surface 1a of the wiring substrate 1 are electrically coupled together via the metal wires 4.

At this time, as shown in FIG. 6, the metal wires 4 coupled to the electrode pads 2cb disposed along the second side 2ab of the main surface 2a of the semiconductor chip 2 are subjected to wire bonding in such a manner as to have three different loop heights.

Specifically, the first wires 4a coupled to the bonding leads 1ca provided in the positions (line) closest to the semiconductor chip 2 are set to have the lowest loop height, while the third wires 4c coupled to the bonding leads 1cc provided in the positions (line) farthest from the semiconductor chip 2 have the highest loop height in performing the wire bonding. Further, the second wires 4b coupled to the bonding leads 1cb disposed in the intermediate line are set to have the intermediate loop height in performing the wire bonding.

On the other hand, the metal wires 4 coupled to the electrode pads 2cd provided along the fourth side 2ad of the main surface 2a of the semiconductor chip 2 are set to have two different kinds of loop heights in performing the wire bonding.

Specifically, the loop height of the fourth wire 4d coupled to the bonding leads 1cd provided in the positions (line) close to (inside) the semiconductor chip 2 among the bonding leads 1c in two lines are set to be lower than that of the fifth wire 4e coupled to the bonding lead 1ce provided in the positions (line) far away from (outside) the semiconductor chip 2 in performing the wire bonding.

That is, on a side of the fourth side 2ad of the semiconductor chip 2, the loop height of the fifth wire (metal wire 4) 4e is set higher than that of the fourth wire (metal wire) 4d in performing the wire bonding.

In this way, the wire bonding is performed in such a manner that the metal wires 4 have a plurality of different kinds of loop height, which can prevent the occurrence of the electric short circuit between the metal wires formed by performing the wire bonding on the respective bonding leads is formed in the lines, such as two lines or three lines.

As shown in FIG. 7, the sixth wires (metal wires 4) 4f coupled to the bonding leads 1cf are provided in a region between the semiconductor chip 2 and the third side (long side) 1ac of the wiring substrate 1, and are set to have one type of loop height in performing the wire bonding.

Note that the wire bonding is performed in the order of increasing the loop height in order to perform the wire bonding with a plurality of kinds of (multiple stages) of loop heights.

In this way, the wire bonding on the three sides (second side 2ab, third side 2ac, and fourth sides 2ad) of the main surface 2a of the semiconductor chip 2 is completed. Thus, the electrode pads (first electrode pads) 2ca provided along the first side 2aa are the dummy electrode pads, where the wire bonding is not performed.

Then, resin molding is performed. As shown in FIGS. 6 and 7, the semiconductor chip 2 and the metal wires 4 are sealed with resin, thereby forming the seal body 7 over the upper surface 1a of the wiring substrate 1.

Referring to FIG. 14, in the resin molding step of this embodiment, resin 9 for sealing (resin) shown in FIG. 15 is charged from the third side 2ac opposed to the first side 2aa without any metal wires 4 among four sides of the main surfaces 2a of the semiconductor chip 2, thereby producing the seal body 7 as a single unit.

That is, when charing the resin in the resin molding step, the resin 9 for sealing is charged in the resin charging direction P from the third side 2ac opposed to the first side 2aa not having the metal wires 4 at the main surface 2a of the semiconductor chip 2.

At this time, as shown in FIG. 15, the resin 9 for sealing flows to the respective device regions 8a of the multi-piece substrate 8 in the flowing direction Q via a pot 10 and a runner 11.

In charging the resin, as the resin 9 for sealing is located farther away from the charging side (sealing inlet) S in each device region 8a, the curing of the resin 9 is promoted, thereby easily inducing the wire flow. That is, in the portion R shown in FIG. 15, the wire flow of the resin 9 for sealing is more likely to be generated.

In the assembly of the BGA 5 of this embodiment, the wire bonding is not performed on one of the four sides of the main surface 2a of the semiconductor chip 2 without disposing the metal wire 4 at this side. When charging the resin in the resin molding step, the resin 9 for sealing is charged from the third side 2ac opposed to the first side 2aa not having any metal wires 4 of the semiconductor chip 2, toward the first side 2aa side, so that the metal wire 4 is not arranged on the side T far away from the charging side S of the resin 9 for sealing, which hardly causes the wire flow.

That is, the metal wire 4 is not arranged on the side that promotes the curing of the resin 9 for sealing, which can suppress the occurrence of the wire flow. In short, the resin 9 for sealing charged can reduce inconveniences, including the contact of the metal wire 4 with another adjacent metal wire 4 because of the wire flow.

In the way described above, the seal body 7 is formed as a single unit over the multi-piece substrate 8, thus resulting in completion of the resin mold step.

Then, as shown in FIG. 6, the solder balls (terminals for external coupling, external electrode terminal) 3 are formed over the respective lands 1d at the lower surface 1b of the wiring substrate 1 (multi-piece substrate 8).

Thereafter, the multi-piece substrate 8 shown in FIG. 15 is cut into a package size, which completes the assembly of the BGA 5.

Although the invention made by the inventors has been specifically described based on the embodiments, the invention is not limited to the above embodiments. It is apparent that various modifications and changes can be made without departing from the scope of the invention.

Although this embodiment has explained that the main surface 2a of the semiconductor chip 2 is formed in a rectangular shape similar to a square shape by way of example, the main surface 2a of the semiconductor chip 2 may be formed in a square shape.

Although in the above embodiments, the semiconductor device is the BGA by way of example, the semiconductor device may be a land grid array (LGA) including conductive members provided at the surfaces of the lands 1d on the lower surface 1b of the wiring substrate 1.

What is claimed is:

1. A semiconductor device, comprising:
   a wiring substrate having a first surface and a second surface opposite thereto, the first surface being formed in a rectangular shape and provided with a plurality of leads;
   a semiconductor chip having a quadrilateral main surface and a back surface opposite thereto, the main surface being provided with a plurality of electrode pads, the semiconductor chip being mounted over the first surface of the wiring substrate;
   a plurality of metal wires for electrically coupling the leads of the wiring substrate to the electrode pads of the semiconductor chip; and
   a plurality of terminals for external coupling provided at the second surface of the wiring substrate,
   wherein the metal wires are respectively arranged at three out of four sides of the main surface of the semiconductor chip,
   wherein the leads are provided in:
      a plurality of lines at the first surface of the wiring substrate along a short side of the first surface outside the respective sides of any one of two pairs of the opposed sides of the main surface of the semiconductor chip; and
      a line formed along a long side of the first surface, a distance between the short side of the first surface and the plurality of lines being greater than a distance between the long side of the first surface and the line formed along the long side of the first surface, and
   wherein the metal wires are electrically coupled to the leads.

2. The semiconductor device according to claim 1, wherein the metal wires arranged in parallel along the short side of the first surface of the wiring substrate are arranged at two opposed sides of the main surface of the semiconductor chip,
   wherein the leads are provided in lines along the short side of the first surface outside the two opposed sides of the chip, and
   wherein the metal wires are electrically coupled to the leads.

3. The semiconductor device according to claim 2, wherein the metal wires are arranged at one side intersecting the two opposed sides of the main surface of the semiconductor chip,
   wherein the line formed along a long side of the first surface comprises leads which are arranged in one line outside the intersecting one side at the first surface of the wiring substrate, and
   wherein the metal wires are electrically coupled to the leads.

4. The semiconductor device according to claim 2, wherein the leads are provided in three lines along the short side of the first surface outside one of the two opposed sides of the chip.

5. The semiconductor device according to claim 2, wherein the leads are provided in two lines along the short side of the first surface outside the other side of the two opposed sides of the chip.

6. The semiconductor device according to claim 2, wherein the line formed along a long side of the first surface comprises leads which are are provided in one line along the long side of the first surface outside one side intersecting the two opposed sides of the chip.

7. The semiconductor device according to claim 1, wherein the semiconductor chip includes a memory circuit and a logic circuit.

8. The semiconductor device according to claim 1, wherein the main surface of the semiconductor chip is formed in a rectangle shape, and
   wherein two opposed long sides of the main surface of the rectangle shape are arranged to extend along the respective long sides of the first surface of the wiring substrate.

9. The semiconductor device according to claim 8, wherein the leads are provided in a plurality of lines at the first surface of the wiring substrate outside the respective opposed short sides of the main surface of the semiconductor chip along the respective short sides, and
   wherein the metal wires are electrically coupled to the leads formed in the lines.

10. The semiconductor device according to claim 8, wherein a plurality of first electrode pads are formed at the main surface along the side not having the metal wires disposed thereat among the sides of the rectangle main surface of the semiconductor chip; and
   wherein the metal wire is not coupled to any one of the first electrode pads.

11. The semiconductor device according to claim 10, wherein the first electrode pads are electrically coupled to a protective circuit formed in the semiconductor chip.

12. The semiconductor device according to claim 8, wherein a plurality of respective electrode pads formed at the main surface of the semiconductor chip along the two opposed short sides of the main surface of the semiconductor chip is provided in a staggered arrangement.

13. The semiconductor device according to claim 8, further comprising:
   a wiring pattern formed on the first surface of the wiring substrate,
   wherein the wiring pattern is not formed beside one of the two opposed long sides of the main surface of the semiconductor chip with the metal wires disposed thereat and outside the line formed along the long side of the first surface of the wiring substrate.

14. The semiconductor device according to claim 1, wherein a seal body is formed over the first surface of the wiring substrate to seal the semiconductor chip and the metal wires therewith.

15. The semiconductor device according to claim 1, further comprising:
a wiring pattern formed on the first surface,
wherein the semiconductor chip is formed in a chip mounting region on the first surface of the wiring substrate, and the wiring pattern comprises a wiring portion extending from the line formed along the long side of the first surface, into the chip mounting region.

16. The semiconductor device according to claim 15, further comprising:
through hole wirings formed in the wiring substrate in the chip mounting region,
wherein the leads formed in the line formed along a long side of the first surface are electrically coupled to the plurality of terminals via the through hole wirings.

* * * * *